(12) United States Patent
Lang

(10) Patent No.: US 11,646,479 B2
(45) Date of Patent: May 9, 2023

(54) METHOD FOR PRODUCING A WAVEGUIDE, CIRCUIT DEVICE AND RADAR SYSTEM

(71) Applicant: Infineon Technologies AG, Neubiberg (DE)

(72) Inventor: Markus Josef Lang, Pfarrkirchen (AT)

(73) Assignee: Infineon Technologies AG, Neubiberg (DE)

( * ) Notice: Subject to any disclaimer, the term of this patent is extended or adjusted under 35 U.S.C. 154(b) by 346 days.

(21) Appl. No.: 16/743,134

(22) Filed: Jan. 15, 2020

(65) Prior Publication Data

US 2020/0235453 A1 Jul. 23, 2020

(30) Foreign Application Priority Data

Jan. 21, 2019 (DE) .......................... 102019200689.2
Jan. 24, 2019 (DE) .......................... 102019200893.3

(51) Int. Cl.
| | | |
|---|---|---|
| H01P 3/12 | (2006.01) | |
| H05K 1/18 | (2006.01) | |
| H05K 3/00 | (2006.01) | |
| H01P 11/00 | (2006.01) | |
| G01S 7/03 | (2006.01) | |
| G01S 7/35 | (2006.01) | |

(52) U.S. Cl.
CPC .............. *H01P 3/121* (2013.01); *G01S 7/032* (2013.01); *G01S 7/35* (2013.01); *H01P 11/002* (2013.01); *H05K 1/181* (2013.01); *H05K 3/0026* (2013.01); *H05K 3/0044* (2013.01); *H05K 2201/10098* (2013.01)

(58) Field of Classification Search
CPC ...................................................... H01P 3/121
USPC .......................................................... 342/200
See application file for complete search history.

(56) References Cited

U.S. PATENT DOCUMENTS

| | | | |
|---|---|---|---|
| 2003/0059151 A1 | 3/2003 | Brist et al. | |
| 2009/0224858 A1* | 9/2009 | Fujita | H01P 3/121 |
| | | | 333/248 |
| 2011/0084047 A1 | 4/2011 | Yeo et al. | |
| 2013/0207700 A1* | 8/2013 | Trotta | H03L 7/06 |
| | | | 327/156 |
| 2014/0287701 A1* | 9/2014 | Herbsommer | H01Q 1/50 |
| | | | 343/818 |
| 2018/0183127 A1* | 6/2018 | Huang | H01P 3/121 |
| 2020/0128702 A1* | 4/2020 | Cheng | H05K 3/4697 |

FOREIGN PATENT DOCUMENTS

| | | |
|---|---|---|
| JP | 2005-003944 A | 1/2005 |
| WO | 2013/079714 A1 | 6/2013 |

* cited by examiner

*Primary Examiner* — Stanley Tso
(74) *Attorney, Agent, or Firm* — Harrity & Harrity, LLP

(57) ABSTRACT

A method for producing a waveguide in a multilayer substrate involves producing at least one cutout corresponding to a lateral course of the waveguide in a surface of a first layer arrangement comprising one or a plurality of layers. A metallization is produced on surfaces of the cutout. A second layer arrangement comprising one or a plurality of layers is applied on the first layer arrangement. The second layer arrangement comprises, on a surface thereof, a metallization which, after the second layer arrangement has been applied on the first layer arrangement, is arranged above the cutout and together with the metallization on the surfaces of the cutout forms the waveguide.

11 Claims, 8 Drawing Sheets

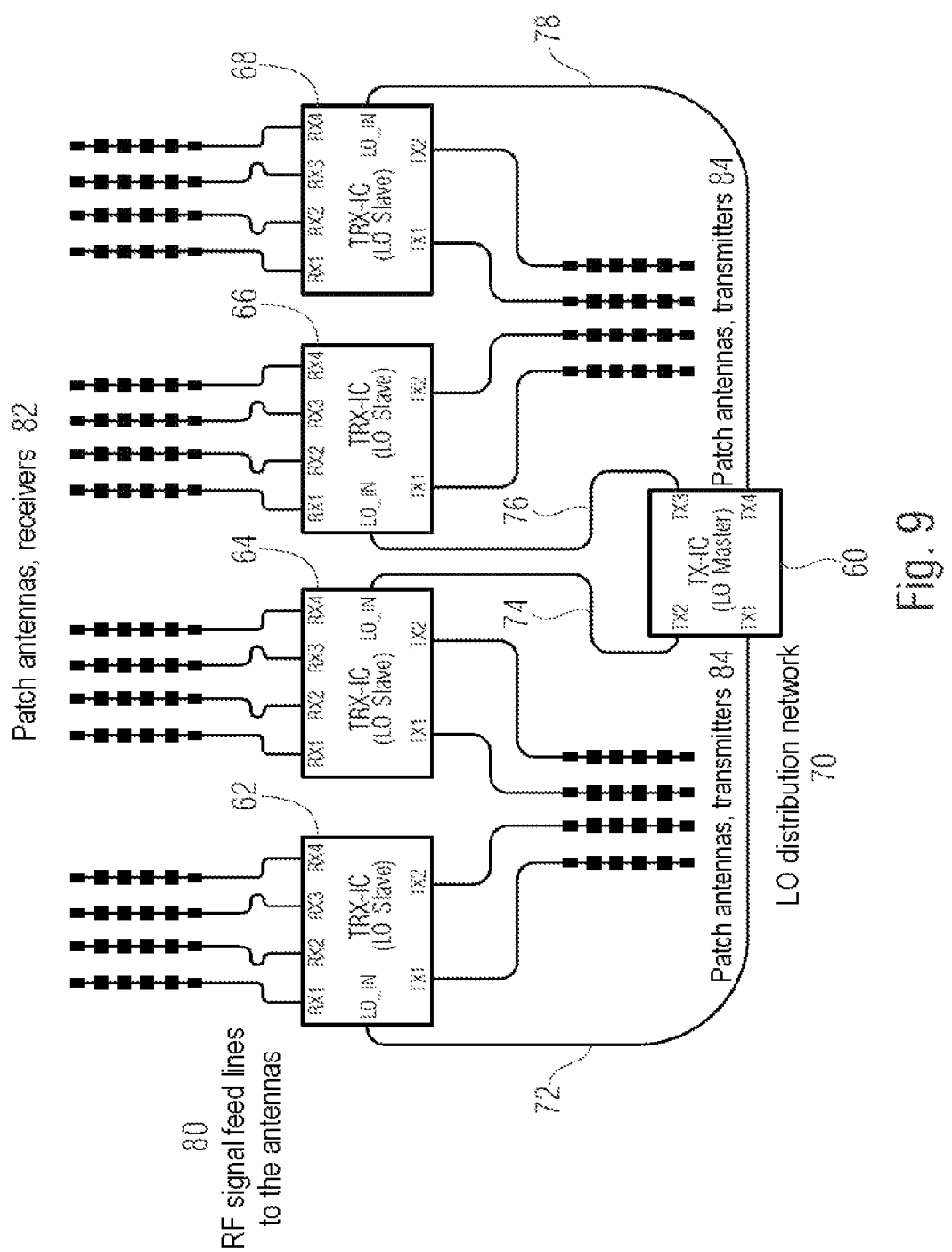

METHOD FOR PRODUCING A WAVEGUIDE, CIRCUIT DEVICE AND RADAR SYSTEM

CROSS REFERENCE TO RELATED APPLICATION

This application claims priority to German Patent Application No. 102019200689.2 filed on Jan. 21, 2019, and to German Patent Application No. 102019200893.3 filed on Jan. 24, 2019, the contents of which are incorporated by reference herein in their entirety.

TECHNICAL FIELD

The present disclosure relates to methods for producing a waveguide, circuit devices and radar systems comprising a waveguide, and to methods, circuit devices and radar systems in which a waveguide is integrated into a multilayer substrate.

BACKGROUND

In radio-frequency circuit arrangements, it is typically necessary to transfer radio-frequency signals between different circuit structures. By way of example, radar systems can comprise transmitting/receiving circuits, local oscillator circuits and antennas, between which radio-frequency signals are transferred. In this case, radio-frequency signals can be in a frequency range of 50 to 100 GHz and higher.

The requirements in respect of recognizing and differentiating various objects are constantly increasing particularly in the case of radar systems in the automotive sector. One influencing variable here is the size of the antenna aperture, which is substantially determined by the number of different transmission and reception channels. Typical radar systems can thus have a plurality of transmitting/receiving circuits, which are sometimes also referred to as transceivers, wherein a typical radar system can comprise for example three transmission channels, TX channels, and four reception channels, RX channels. In order to increase an object differentiability, however, ever more channels are desirable, for example eight transmission channels and sixteen reception channels. Each transmission channel and each reception channel is generally assigned a corresponding transmitting antenna and a corresponding receiving antenna. It may generally be desirable for all transceivers to use the same, as far as possible phase-synchronous, radio-frequency local oscillator signal in order to down-convert received radar signals to the baseband.

In order to transfer or to distribute such radio-frequency signals (RF signals) in a circuit device, expensive printed circuit boards have been used hitherto, wherein microstrip lines are provided on a specific radio-frequency substrate, RF substrate, in order to minimize the losses. However, such known solutions have problems with regard to conduction losses, crosstalk and manufacturing tolerances. In particular, expensive materials are required for producing such RF substrates, wherein the RF substrates have a low tolerance vis-à-vis process fluctuations and vis-à-vis variations of the dielectric.

Overview

Therefore, solutions enabling RF signal transfer in circuit devices with improved properties in particular with regard to conduction loss and crosstalk would be desirable.

Examples of the present disclosure provide methods, circuit devices and radar systems comprising at least one waveguide in a multilayer substrate, such that RF signals can be transferred by way of the waveguide in the multilayer substrate.

Examples of the present disclosure provide a method for producing a waveguide in a multilayer substrate which involves producing at least one cutout corresponding to a lateral course of the waveguide in a surface of a first layer arrangement comprising one or a plurality of layers. A metallization is produced on surfaces of the cutout. A second layer arrangement comprising one or a plurality of layers is applied on the first layer arrangement, wherein the second layer arrangement comprises on a surface thereof a metallization which, after the second layer arrangement has been applied on the first layer arrangement, is arranged above the cutout and together with the metallization on the surfaces of the cutout forms walls of the waveguide.

Examples of the present disclosure provide a circuit device, having the following features: a multilayer substrate; at least one waveguide integrated into the multilayer substrate; a first layer arrangement comprising one or a plurality of layers, wherein the first layer arrangement comprises a cutout corresponding to a lateral course of the waveguide in a surface thereof; a metallization on the surfaces of the cutout; a second layer arrangement, which comprises one or a plurality of layers and is applied on the surface of the first layer arrangement, wherein a metallization on the second layer arrangement is arranged above the cutout and together with the metallization on the surfaces of the cutout forms the waveguide, wherein the metallization on the second layer arrangement leaves open predetermined lateral regions of the cutout in a vertical direction; and coupling elements for coupling signals into and out of the waveguide at the regions of the cutout that are left open in a vertical direction.

Examples of the present disclosure provide a radar system having the following features: a multilayer substrate; at least one waveguide formed in the multilayer substrate; and a first semiconductor radar transmitting/receiving circuit and a second semiconductor radar transmitting/receiving circuit, wherein the first semiconductor radar transmitting/receiving circuit is coupled to the second semiconductor radar transmitting/receiving circuit by way of the waveguide, or wherein the first semiconductor radar transmitting/receiving circuit and the second semiconductor radar transmitting/receiving circuit are coupled to a local oscillator circuit by way of a respective waveguide.

Examples of the present disclosure are based on the insight that the integration of a waveguide into a multilayer substrate in the manner described makes it possible to transfer and to distribute radio-frequency signals in a circuit device comprising the multilayer substrate, wherein firstly conduction losses and crosstalk can be reduced or minimized and secondly expensive RF substrates can be omitted. The integration of waveguides in multilayer substrates in the manner described makes it possible to integrate waveguides flexibly in circuit devices comprising a multilayer substrate, on and in which RF elements, for example in the form of semiconductor circuits, such as e.g. semiconductor chips, and/or antenna elements are provided.

BRIEF DESCRIPTION OF THE DRAWINGS

Examples of the present disclosure are explained in greater detail below with reference to the accompanying drawings, in which:

FIG. 9 shows a circuit diagram of an example of a radar system.

DETAILED DESCRIPTION

Figure 1A:
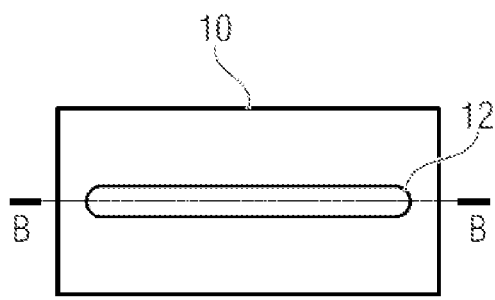
FIGS. 1A-1F show schematic illustrations for an example of a method for producing a waveguide in a multilayer substrate.

Hereinafter, examples of the present disclosure are described in detail using the accompanying drawings. It should be pointed out that identical elements or elements having the same functionality may be provided with identical or similar reference signs in the drawings, in which case a repeated description of such elements may be omitted. Therefore, descriptions for elements having identical or similar reference signs may be mutually interchangeable.

In the following description, a plurality of details are set out in order to yield a more thorough explanation of examples of the present disclosure. However, it is evident to those skilled in the art that examples of the present disclosure can be implemented without these specific details. In other cases, sufficiently known structures and devices are shown in a schematic cross-sectional view or plan view instead of their details being shown, in order not to obscure the description of examples. Moreover, features of the various examples described hereafter can be combined with other features of other examples, unless a contrary indication is expressly given herein.

Figure 1B:

An example of a method for producing a waveguide in a multilayer substrate will now be described with reference to FIGS. 1A to 1F. Firstly, a cutout 12 is produced in a surface of a first layer arrangement 10. The layer arrangement 10 can comprise one or a plurality of layers, for example layers composed of a ceramic or dielectric material. FIG. 1A schematically shows a plan view of the first layer arrangement 10 and FIG. 1B schematically shows a cross-sectional view along the line B-B in FIG. 1A. A direction perpendicular to the main surfaces of the layer arrangement shall be defined as a vertical direction, and a direction parallel thereto shall be defined as a lateral direction. In plan view, the cutout 12 corresponds to a lateral course of the waveguide to be produced. To put it another way, the waveguide to be produced extends laterally in the first layer arrangement and the cutout produced corresponds to a lateral course of the waveguide from a first lateral section thereof to a second lateral section thereof. The first lateral section can be a first lateral end of the waveguide and the second lateral section can be a second lateral end of the waveguide.

Figure 1C:
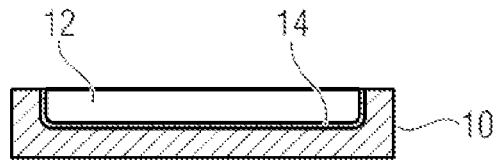
Figure 1D:
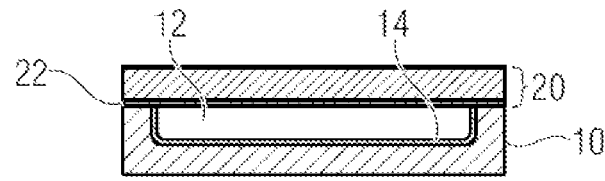

As is shown in FIG. 1C, a metallization 14 is produced on surfaces of the cutout. The metallization 14 can continuously cover all surfaces of the cutout. After the metallization 14 has been produced, a second layer arrangement 20 comprising a metallization 22 on a surface thereof is applied on the first layer arrangement 10. The second layer arrangement 20 can in turn comprise one or a plurality of layers, for example ceramic or dielectric layers. After the second layer arrangement 20 has been applied on the first layer arrangement 10, the metallization 22 of the second layer arrangement is arranged above the cutout 12 and together with the metallization 14 on the surfaces of the cutout 12 forms the waveguide, as is shown in FIG. 1D. The metallization 22 can likewise be continuous in the region of the waveguide formed, such that together with the metallization 14 a waveguide with a continuous metallization in the entire inner surface region of the waveguide is formed.

Figure 1E:
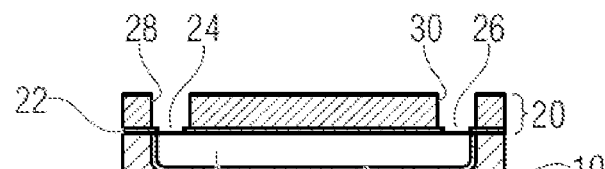
Figure 1F:
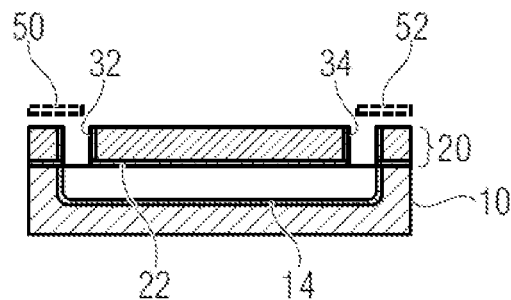

In examples of the present disclosure, the metallization on the second layer arrangement may not cover regions of the cutout at predetermined lateral regions thereof, such that signal coupling into and signal coupling out of the waveguide can take place by way of these regions. In other examples, the metallization on the second layer arrangement is removed in regions of the cutout at predetermined lateral regions thereof after the second layer arrangement has been applied. FIGS. 1A to 1F show one such example. As is shown in FIG. 1E, the metallization 22 is removed at predetermined lateral regions 24 and 26 of the cutout 12. The lateral regions 24, 26 can be lateral ends of the cutout 12 in examples. In examples, the removal can be carried out through openings 28, 30 in the second layer arrangement 20. In examples, the second layer arrangement 20 can have the openings 28, 30 when it is applied. In the example shown, the openings 28, 30 in the second layer arrangement 20 are produced at the predetermined lateral regions of the cutout after the second layer arrangement 20 has been applied on the first layer arrangement 10, in order to make it possible to remove the metallization 22 in the regions 24, 26.

In examples of the disclosure, the openings in the second layer arrangement have been or are metallized and form an extension of the waveguide through at least parts of the second layer arrangement.

In the example shown in FIGS. 1A to 1F, producing the openings 28 and 30 through the second layer arrangement 20 is followed by forming metallizations 32 and 34 on surfaces of the openings 28 and 30 in the second layer arrangement 20. The metallizations 32 and 34 constitute an extension of the waveguide through the second layer arrangement 20, in a vertical direction in the example shown. The waveguide produced thus comprises vertical sections formed by the metallizations 32 and 34 and a lateral section formed by the metallizations 22 and 14.

In the example shown in FIGS. 1A to 1F, the cutout 12 does not completely penetrate through the first layer arrangement 10 in a vertical direction with respect to a main surface of the first layer arrangement 10. The lateral section of the waveguide is thus formed by the metallization 14 on the surface of the cutout 12 and the metallization 22 on the surface of the second layer arrangement 20. In other example implementations, the cutout can completely penetrate through the first layer arrangement in a direction perpendicular to a main surface of the first layer arrangement, e.g. in a vertical direction. One such example will now be described with reference to FIGS. 2A to 2F, these figures in each case again showing different method stages during production.

FIG. 2A once again shows a schematic plan view of the first layer arrangement 10, in which a cutout 36 corresponding to a lateral course of the waveguide is formed. As can be discerned in FIG. 2B, the cutout 36 completely penetrates through the first layer arrangement 10 in this example. In the example shown, the cutout 36 completely penetrates through the first layer arrangement 10 over the entire lateral course. In other examples, the first cutout can completely penetrate through the first layer arrangement 10 at least in sections along the lateral course.

Figure 2A:
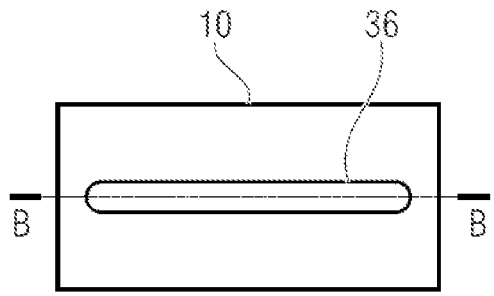
FIGS. 2A-2F show schematic illustrations for a further example of a method for producing a waveguide in a multilayer substrate.
Figure 2B:
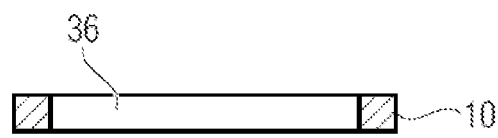
Figure 2C:
Figure 2D:
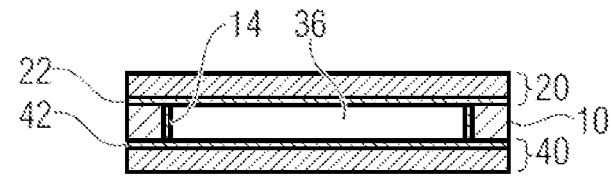

As is shown in FIG. 2C, a metallization 14 is produced on surfaces of the cutout 36. Afterward, a second layer arrangement 20 having a metallization 22 is applied on a first main surface of the first layer arrangement 10. Furthermore, as shown in FIG. 2D, a third layer arrangement 40 having a metallization 42 is applied on a second main surface of the first layer arrangement 10. The third layer arrangement 40 can comprise one or a plurality of layers, for example ceramic or dielectric layers. The second layer arrangement 20 and the third layer arrangement 40 are applied on opposite sides of the first layer arrangement 10, such that the metallization 22 is arranged on a first side of the cutout 36 and the metallization 42 is arranged on a second side of the cutout 36 opposite the first side. The metallizations 22 and 42 together with the metallization 14 on surfaces of the cutout 36 thus form the waveguide.

Figure 2E:
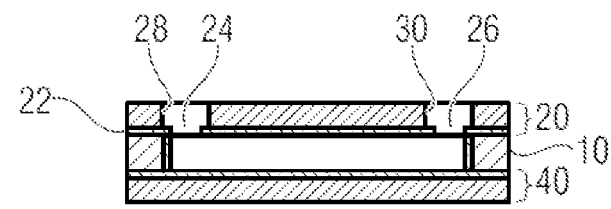
Figure 2F:
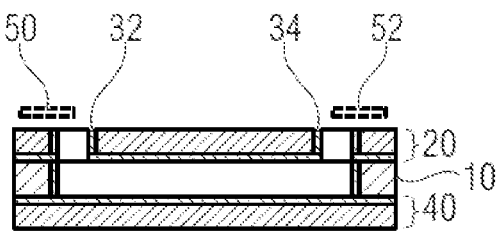

As is shown in FIGS. 2E and 2F, afterward the metallization 22 can once again be removed at predetermined regions 24 and 26, which can once again be carried out by way of openings 28 and 30 in the second layer arrangement 20. The openings 28 and 30 in the second layer arrangement 20 can then once again be metallized in order to produce metallizations 32 and 34 constituting an extension of the waveguide through the second layer arrangement 20.

In examples, waveguides are thus produced in a multilayer substrate by virtue of metallizations being provided on various layer arrangements and the layer arrangements being connected to one another in such a way that the metallizations define walls of the waveguide. Waveguides having various courses can thus be integrated into a multilayer substrate in a flexible manner. The multilayer substrate can be for example a substrate which is additionally configured for receiving semiconductor components at regions provided therefor. Accordingly, the multilayer substrate can comprise e.g. contact connection regions and electric lines, as known for instance from printed circuit boards for semiconductor components.

In examples, the metallization on the surfaces of the cutout and the metallization on the second layer arrangement and, if present, the third layer arrangement extend continuously between the predetermined lateral regions. It is thus possible to form a waveguide having continuous metallic surfaces, which waveguide enables low conduction losses and low crosstalk, in a multilayer substrate.

In examples of the present disclosure, provision can be made of coupling elements for coupling signals into and out of the waveguide at the predetermined lateral regions at which the metallization on the second layer arrangement does not cover the cutout. Coupling elements 50 and 52 are schematically illustrated by dashed lines in FIGS. 1F and 2F. The coupling elements can be formed for example by patch antennas designed to couple electromagnetic RF signals into the waveguide and/or to couple electromagnetic RF signals out of the waveguide.

In examples of the present disclosure, therefore, at least one coupling element can be formed by an antenna, wherein the antenna can be formed in or on a housing of an RF circuit chip fitted in or on the multilayer substrate, or wherein the antenna can be fitted on the multilayer substrate. In examples, furthermore, reflectors can be provided on a side of the coupling elements facing away from the first layer arrangement.

In examples, the cutout can be formed in the first substrate arrangement by any suitable methods, for example by milling, by a laser treatment, by etching methods or the like. In examples, the first layer arrangement can comprise a plurality of layers of the multilayer substrate, in which layers signal routing structures comprising vias and conductor tracks are formed. In examples, the second layer arrangement can comprise a plurality of layers of the multilayer substrate, in which layers signal routing structures comprising vias and conductor tracks are formed. In examples, the first and second layer arrangements are fitted on a plurality of layers of the multilayer substrate, in which layers signal routing structures comprising vias and conductor tracks are formed.

Examples of the present disclosure provide methods for producing a circuit comprising a multilayer substrate. The multilayer substrate is produced comprising a plurality of layers, in which signal routing structures comprising vias and conductor tracks are formed. The multilayer substrate comprises RF elements on or in the multilayer substrate. The RF elements can comprise transmitting/receiving circuits and local oscillator circuits, for example. The RF elements can be formed by semiconductor circuits in the form of semiconductor chips. At least one waveguide is formed in the multilayer substrate by methods as described herein, wherein at least one terminal of a first RF element is coupled by way of the at least one waveguide to a terminal of a second RF element for signal transfer between same.

In examples, the RF elements can comprise a local oscillator circuit, at least one transmitting/receiving circuit and at least one antenna, wherein producing at least one waveguide comprises producing a waveguide that couples the local oscillator circuit to the at least one transmitting/receiving circuit, and/or producing a waveguide that couples the at least one transmitting/receiving circuit to the at least one antenna. In examples, the circuit can be a radar circuit, wherein the RF elements comprise a plurality of transmitting/receiving circuits, a plurality of receiving antennas, a plurality of transmitting antennas, and a local oscillator circuit, wherein producing at least one waveguide comprises producing a plurality of waveguides in order to couple the local oscillator circuit to each of the transmitting/receiving circuits, and to couple the transmitting/receiving circuits to the plurality of receiving antennas and transmitting antennas.

Examples of the present disclosure are described below on the basis of a radar circuit device. However, there is no need to mention separately that other circuit devices in which RF signals are transferred can also be implemented using methods and devices such as are described herein. Generally, examples of the present disclosure are applicable to circuit devices in which RF signals are transferred between RF elements, in particular RF semiconductor circuits, e.g. semiconductor chips.

As was mentioned in the introduction, the requirements made of radar systems in the automotive sector with regard to recognizing and differentiating various objects are constantly increasing, wherein, in order to attain a desired number of channels, by way of example, a plurality of radar transceivers in a cascade circuit can be used. In the case of such a cascade circuit, it is desirable for all transceivers to use the same, as far as possible phase-synchronous, radio-frequency local oscillator signal, LO signal, to down-convert the received radar signals to the baseband. In examples, the radio-frequency local oscillator signal can have a frequency of more than 50 GHz, for example between 76 and 81 GHz. The distribution of signals of such high frequency entails a number of problems. Firstly, signals of such high frequency are subject to specific losses on the printed circuit board, which has the effect that the power of the radio-frequency signals be correspondingly high, which results in unnecessary heating of the circuit that provides the radio-frequency signal. The circuit that provides the radio-frequency signal can be e.g. an LO master. The high power consumption of the LO master can be a burden on the thermal budget of the entire radar circuit and thus restrict the performance thereof and/or require expensive, complex measures for removing the heat. Furthermore, undesired crosstalk between the radio-frequency LO signal and the transmission and/or reception paths of the radar transceivers on the printed circuit board can reduce the performance of the radar circuit, which is sometimes also referred to as a radar sensor. Furthermore, expensive printed circuit boards have been required hitherto, wherein the properties of the printed circuit board materials, for example the dielectric conductivity and the coefficient of thermal expansion, have been permitted to fluctuate very little, in order to keep the influences, for example the signal damping, on the various LO paths as constant as possible.

Besides the distribution of the radio-frequency LO signal, feed lines from the transceivers to the transmitting-receiving antennas are also affected by the problems mentioned. Here, too, it is beneficial to keep losses low and crosstalk low. Examples of the present disclosure serve to alleviate the problems mentioned using the integration of waveguides integrated into a multilayer substrate.

FIG. 9 schematically shows a circuit diagram of a radar circuit comprising an LO circuit 60 and four transceiver circuits 62, 64, 66 and 68. The circuits can be formed in each case by integrated circuits, IC, or integrated circuit chips. The LO circuit 60 constitutes an LO master, which makes a radio-frequency LO signal available to the transceiver circuits 62 to 68. The transceiver circuits 62 to 68 thus constitute LO slaves. In order to distribute the LO signal, the LO circuit 60 is connected to the transceiver circuits 62 to 68 by way of an LO distribution network 70. To put it more precisely, a respective transmission output TX1, TX2, TX3 and TX4 is connected to a local oscillator input LO_IN of a respective transceiver circuit 62, 64, 66, 68 by way of an assigned signal line 72, 74, 76, 78. Each of the transceiver circuits 62 to 68 has a plurality of transmission outputs and a plurality of reception inputs. In the example shown, each transceiver circuit 62 to 68 has two transmission outputs TX1, TX2 and four reception inputs RX1, RX2, RX3 and RX4. The transmission outputs and reception inputs of the transceiver circuits are connected to receiving antennas 82 and transmitting antennas 84 by way of RF signal feed lines 80. The receiving antennas 82 and the transmitting antennas 84 can be formed by patch antennas, as is shown in FIG. 9. FIG. 9 thus shows a typical LO distribution network and RF signal feed lines to the antennas for a radar frontend circuit having eight transmission channels and sixteen reception channels. It goes without saying that comparable circuits can also be implemented with a different number of channels. Furthermore, passive RF elements such as e.g. ring coupler structures having a plurality of inputs/outputs can also be formed by the waveguide having a corresponding shape and routing. In the case of cascaded radar devices, such ring coupler structures can make it possible that, in the event of failure of a transceiver circuit operating as master, which transceiver circuit, in the original configuration, distributes the LO signal to the radar devices operating as slaves, in a new configuration, a transceiver circuit operating hitherto as a slave becomes the new master, which undertakes the LO distribution to the further MMIC, without the need for an active switchover in the LO distribution network. Likewise, in the present examples, the lateral course of the waveguide can be configured arbitrarily and have for example straight subsections, round subsections or angular subsections.

In examples of the present disclosure, one or more of the signal lines 72, 74, 76, 78 and one or more of the RF signal feed lines 80 to the antennas can be implemented by a waveguide as described herein. In examples, a corresponding waveguide can be implemented for each RF signal path of the radar circuit, e.g. both for all signal lines 72, 74, 76 and 78 and for all RF signal feed lines 80 to the receiving antennas 82 and the transmitting antennas 84.

In this case, a waveguide should be understood herein to mean a waveguide which is not filled with a solid material, e.g. which is material-free. To put it more precisely, the interior between the walls of the waveguide is not filled with a solid material, but rather with a fluid, such as e.g. air. In this case, the dimensions of the waveguide can be adapted to the desired frequency range. By way of example, Table 1 shows typical dimensions and frequency ranges of waveguides having a rectangular cross section.

TABLE 1

| Waveguide designation | Recommended frequency range [GHz] | Dimension A [mm] | Dimension B [mm] |
|---|---|---|---|
| WR12 | 60-90 | 3.0988 | 1.5494 |
| WR10 | 75-110 | 2.54 | 1.27 |
| WR8 | 90-140 | 2.032 | 1.016 |
| WR6 | 110-170 | 1.651 | 0.8255 |
| WR5 | 140-220 | 1.2954 | 0.6477 |

In Table 1, the first column shows generally used designations of waveguides. The dimensions A and B represent the inner side lengths of the rectangular waveguide. Table 1 reveals that the dimensions of the waveguide decrease as the frequency increases. Examples of the present disclosure are thus suitable in particular for circuit devices, for example radar circuits, for high frequency ranges of 60 to 220 GHz, for example.

Figure 3:
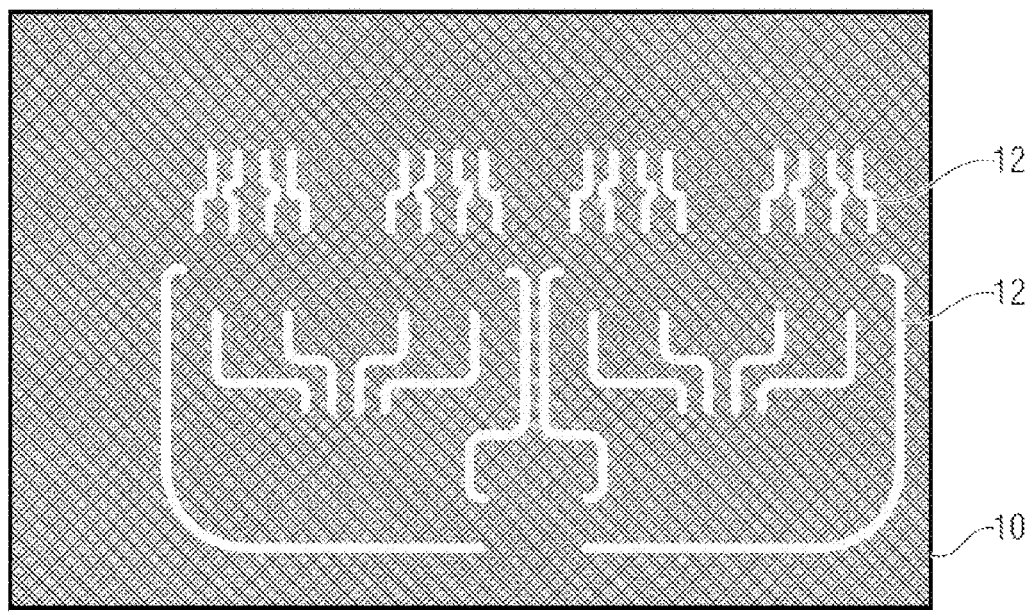
FIGS. 3 and 4 show schematic illustrations of layers of a multilayer substrate which comprise waveguide structures.
Figure 4:
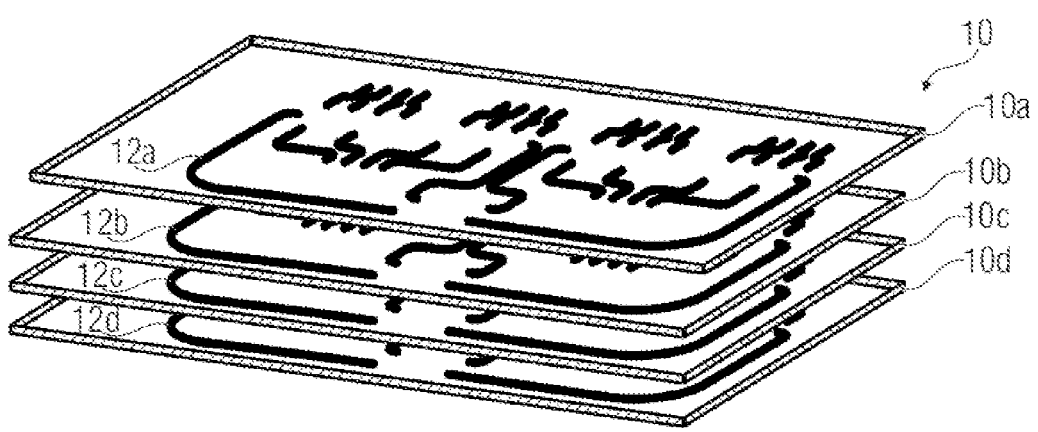

As has been explained above, in the case of a circuit arrangement as shown in FIG. 9, for example, all the RF signal lines can be implemented by waveguides. In this case, the arrangement of the elements of the circuit diagram shown in FIG. 9 can be regarded as a layout which advantageously enables a corresponding connection of a local oscillator circuit 60 to transceiver circuits 62, 64, 66 and 68 and of the transceiver circuits 62 to 68 to respective antennas 82 and 84. In order to implement the signal connections, it is possible to use for example waveguides having a layout as shown in FIG. 3. In this case, FIG. 3 shows a plan view of a first layer arrangement, and cutouts, only two of which are designated by the reference signs 12 by way of example, have been produced in the first layer arrangement, as has been described above. As is shown schematically in FIG. 4, the first layer arrangement 10 can comprise a plurality of layers 10a to 10d, in which corresponding cutouts for waveguides are formed. To put it more precisely, in plan view respectively overlapping cutouts in the various layers 10a to 10d jointly form a waveguide. It should be noted here that FIG. 4 represents an exploded illustration and the layers 10a to 10d are connected to one another at main surfaces thereof. In this case, the cutouts in the individual layers are generally produced after the layers have been connected. Consequently, by way of example, the cutouts 12a, 12b, 12c and 12d overlap in plan view and form a continuous cutout, the lateral course of which corresponds to the lateral course of the waveguide that is integrated into a multilayer substrate in accordance with the present disclosure. Furthermore, in one example of a layer arrangement 10, it may be possible to form respective waveguides in different layers, which can avoid crossing of waveguides e.g. in specific layouts.

In examples, the individual layers are firstly pressed in order to produce the first layer arrangement 10, wherein cutouts are then produced in the correspondingly pressed layers, the cutouts corresponding to the lateral course of the waveguide structures to be produced. In examples, this cutout can have a U-shape in a vertical section. In examples, the cutout can be produced by laser treatment or be milled. The milled-out U-shape is then metallized and an upper layer, which constitutes a second layer arrangement in accordance with the present disclosure and has a metallization, is applied on the side in which the cutout is formed. The upper layer is then pressed with the other layers, such that the metallization on the upper layer and the metallization on the surfaces of the cutout give rise to the waveguide.

Examples of the present disclosure provide circuit devices which can be produced using methods as described herein. To put it more precisely, each waveguide as described herein can be produced using individual or all method features as described herein.

Examples of such circuit devices in which a first RF circuit is connected to a second RF circuit by way of a corresponding waveguide will now be explained in greater detail with reference to FIGS. 5 to 8. It is assumed in this description that the first RF circuit is an LO master, e.g. a circuit that provides an LO signal, and the second circuit is an LO slave, e.g. a circuit that receives an LO signal. However, there is no need to mention separately that the first and second RF circuits can also be formed by other RF circuits.

As is shown in FIGS. 5 to 8, the circuit devices each comprise a multilayer substrate 100, into which a waveguide 102 is integrated. The waveguide here may have been produced in each case by a method as described herein, wherein in such a case a possible boundary between a first layer arrangement and a second layer arrangement is indicated by a dashed line 104 in FIGS. 5 to 8.

Figure 5:
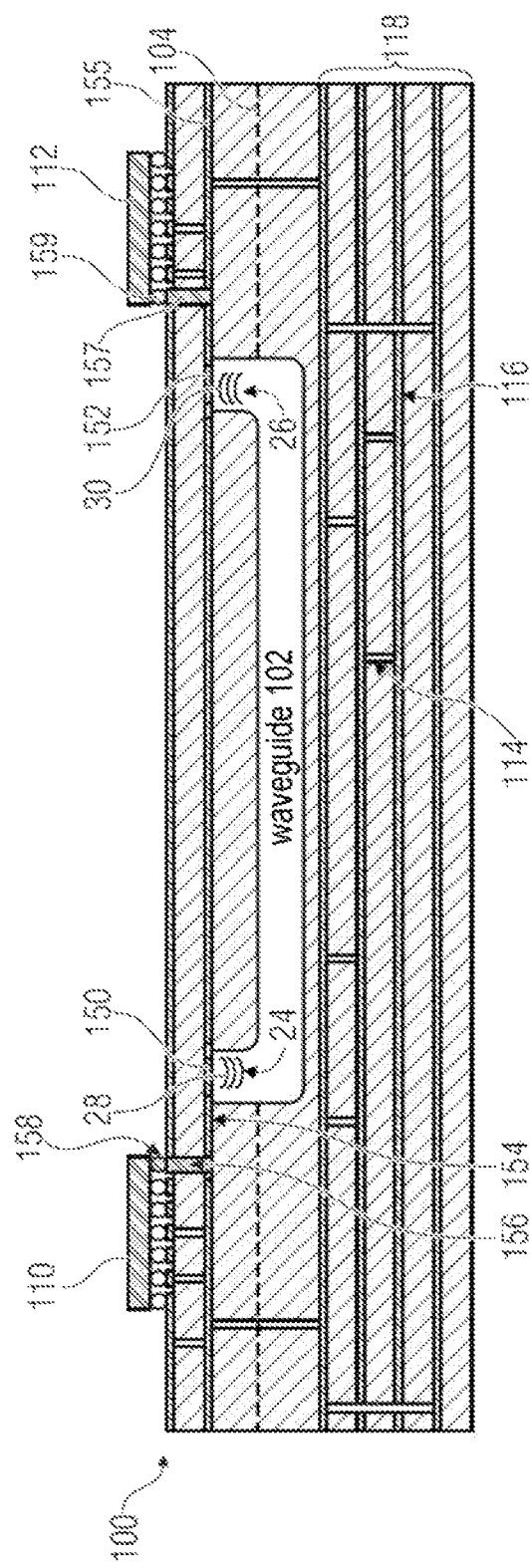
FIGS. 5-8 show schematic illustrations of various examples of circuit devices in which a waveguide is integrated into a multilayer substrate.

In the example shown in FIG. 5, an LO master 110 and an LO slave 112, for example each in the form of an MMIC (monolithic microwave integrated circuit) are provided on the top side of the multilayer substrate 100. In examples, the LO master 110 and the LO slave 112 can comprise an eWLB housing (eWLB=embedded wafer level ball grid array). Vias 114 and signal layers 116 can be provided in the multilayer substrate 100. These constitute other signal routing structures 118 in the multilayer substrate. In the example shown in FIG. 5, the part of the multilayer substrate 100 below the dashed line 104 can be regarded as a first layer arrangement comprising a plurality of layers. The part of the multilayer substrate 100 above the dashed line 104 can be regarded as a second layer arrangement. The first layer arrangement has a cutout corresponding to a lateral course of the waveguide 102 in a surface thereof. A metallization is provided on the surface of this cutout. The second layer arrangement has on an underside thereof a metallization, which together with the metallization on the surfaces of the cutout forms the waveguide. The metallization on the second layer arrangement leaves open predetermined lateral regions 24, 26 of the cutout in the vertical direction, e.g. upward in FIG. 5. In the example shown, the predetermined lateral regions are lateral ends of the cutout. Furthermore, the second layer arrangement has openings 28, 30 at the predetermined lateral regions 24, 26, wherein surfaces of the openings 28, 30 in the second layer arrangement are metallized and form an extension of the waveguide 102 through at least parts of the second layer arrangement. This extension can extend in a vertical direction, while the rest of the waveguide 102, e.g. in the first layer arrangement, extends in a lateral direction.

Coupling elements in the form of patch antennas 150, 152 are provided in a manner overlapping the openings 28, 30 in order to couple RF signals into the waveguide 102 and to couple the signals out of the waveguide. The patch antennas 150, 152 can be connected to a respective RF solder ball 158, 159 of the LO master 110 and of the LO slave 112 by way of a respective line structure 154, 155 and a respective RF-suitable via 156, 157. The line structure 154, 155 can comprise for example a microstrip line and a matching structure for impedance matching. In examples, the microstrip line itself can fulfill the function of impedance matching.

In the example of a circuit device as shown in FIG. 5, an RF signal is conducted into the interior of the multilayer substrate 100 by way of the RF solder ball 158 and the RF-suitable via 156. In the interior, impedance matching can be carried out by way of the line structure 154 and the RF signal can be routed to the patch antenna 150 by way of a microstrip line of the line structure 154. The patch antenna 150 emits the RF signal into the waveguide 102 integrated into the multilayer substrate 100. The RF signal is received again on the part of the LO slave 112 by way of the further patch antenna 152. From the patch antenna 152, the RF signal can be routed to the RF solder ball 159 of the LO slave 112 by way of the line structure 155 and the RF-suitable via 157.

The example shown in FIG. 5 may be advantageous to the effect that the MMIC circuits do not have to be integrated into the multilayer substrate, but rather can be provided on a surface of the multilayer substrate. It is thus possible to reuse customary heat dissipation concepts since the MMIC circuits are not covered.

Figure 6:
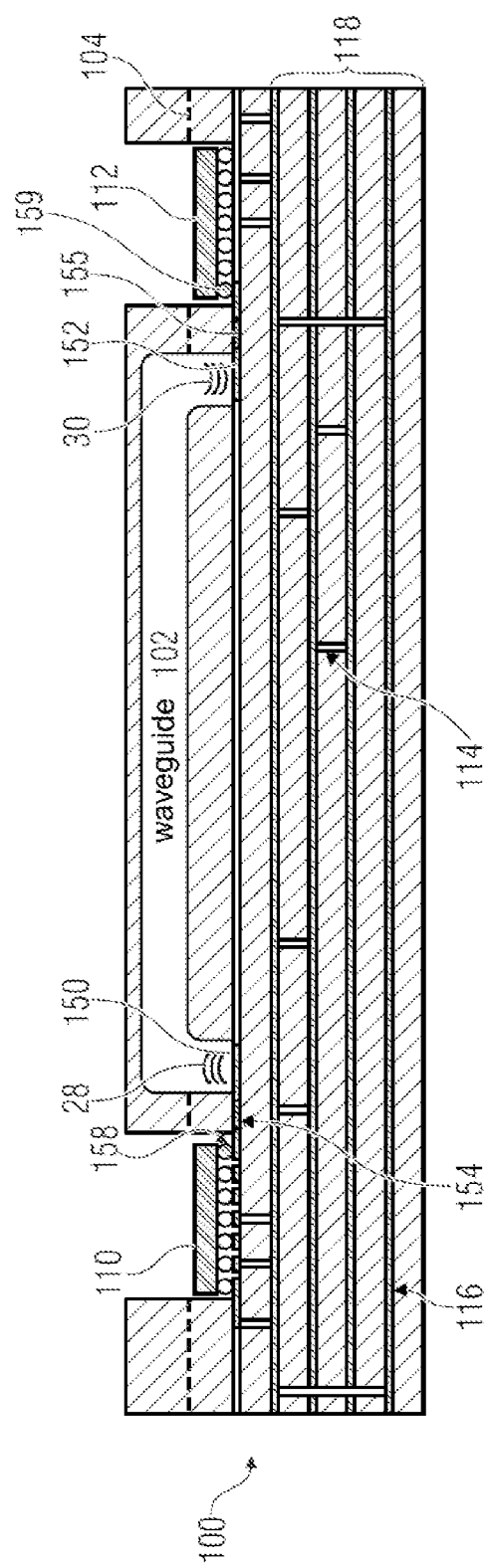

FIG. 6 shows one example of a circuit device in which the MMIC circuits 110 and 112 are recessed into the multilayer substrate 100 and the waveguide 102 is not integrated downward into the multilayer substrate, but rather is emplaced from above. The MMIC circuits 110, 112 are arranged in cutouts in a surface of the multilayer substrate. In the example shown in FIG. 6, that part of the multilayer substrate 100 which is arranged above the dashed line 104 can be regarded as a first layer arrangement, and that part of the multilayer substrate 100 which is arranged below the dashed line 104 can be regarded as a second layer arrangement. The waveguide is once again formed by corresponding metallizations on surfaces of a cutout in the first layer arrangement and on the second layer arrangement. Once again vertical sections of the waveguide extend through openings 28 and 30 in the second layer arrangement, the waveguide being open downward in this example. Once again patch antennas 150 and 152 are coupled to the openings in order to couple corresponding RF signals into the waveguide and to couple them out of the latter. Since the MMIC circuits 110 and 112 are recessed into the multilayer substrate 100, RF-suitable vias are not required in this example. Rather, the line structures 154, 155 are directly connected to respective solder balls 158, 159 of the assigned MMIC element 110, 112. The example shown in FIG. 6 may be advantageous to the effect that customary layer constructions of a multilayer substrate can be reused.

Figure 7:
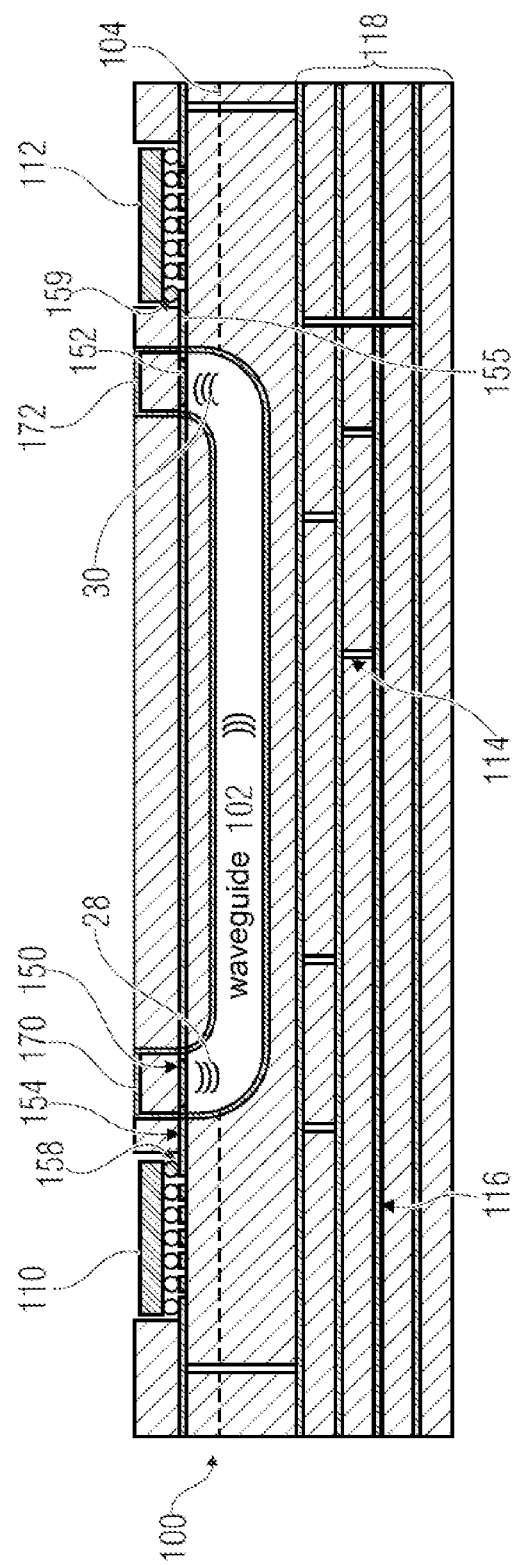

FIG. 7 shows a further example of a circuit device in which the MMIC elements 110 and 112 are recessed into the multilayer substrate 100 and the waveguide 102 is integrated downward into the multilayer substrate. The MMIC elements are arranged in cutouts in a surface of the multilayer substrate 100. In this example, once again the part of the multilayer substrate below the dashed line 104 can be regarded as a first layer arrangement and the part above the line can be regarded as a second layer arrangement. The waveguide 102 can thus be formed in the multilayer substrate 100 in a manner similar to that in the case of the example shown in FIG. 5. Since the MMIC elements 110 and 112 are once again recessed in the multilayer substrate, an RF-suitable via is not required and the respective patch antennas 150 and 152 can once again be connected directly to a respective solder ball 158, 159 of the respective MMIC element 110 and 112 by way of a respective line structure 154, 155. In order to prevent emission from the patch antennas 150 and 152 upward, reflectors 170 and 172 can respectively be provided, which are arranged on sides of the patch antennas 150 and 152 facing away from the waveguide 102. The reflectors 170 and 172 can be formed for example by corresponding metallizations in that layer of the multilayer substrate 100 which is arranged above the patch antennas 150 and 152. The reflectors 170 and 172 can thus be integrated into the printed circuit board. Since, in the example shown in FIG. 7, the waveguide extends from the patch antennas 150 and 152 downward into the multilayer substrate 100 and reflectors 170 and 172 are provided, the MMIC elements 110 and 112 need not be recessed into the multilayer substrate 100 as far as in the example shown in FIG. 6.

Figure 8:
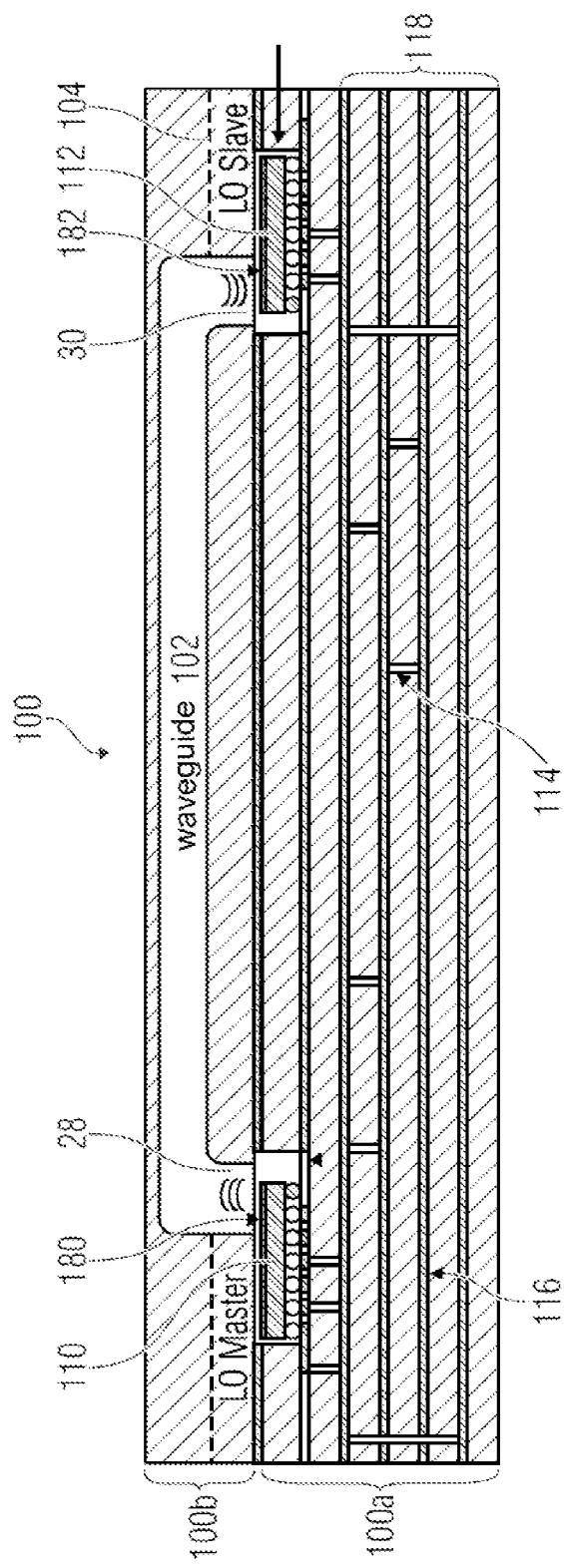

A further example of a circuit device is shown in FIG. 8. In the example shown in FIG. 8, the MMIC elements 110 and 112 are integrated into the multilayer substrate. To put it more precisely, the MMIC elements 110 and 112 are inserted in cutouts in the multilayer substrate. In this example, the multilayer substrate comprises a first part 100a and a second part 100b. The MMIC elements are inserted in cutouts of the first part 100a which are open upward. The second part 100b is placed onto the first part 100a. The waveguide 102 is formed in the second part 100b, as described herein. In this case, that part of the multilayer substrate which is situated above the dashed line 104 can be regarded as a first layer arrangement, and that part of the multilayer substrate 100 or of the second part 100b of the multilayer substrate which is situated below the dashed line 104 can be regarded as a second layer arrangement. Openings 28 and 30, which penetrate through the second layer arrangement completely or partly, depending on the standpoint, are arranged in such a way that they are arranged opposite patch antennas 180 and 182 integrated into the housing of the MMIC elements 110 and 112.

In the example shown in FIG. 8, the first part 100a and the second part 100b of the multilayer substrate can be produced separately from one another, and the second part 100b, which comprises the waveguide 102, can be placed onto the first part 100a. In this variant, the antennas can be situated in the housing, package, on the rear side of the MMIC elements. In the case of such an arrangement, an RF transition from the respective MMIC element to the multilayer substrate is not necessary, with the result that fewer losses occur and more expedient printed circuit boards can be used.

It is evident to those skilled in the art that other implementations are possible besides the examples shown in FIGS. 5 to 8. Generally, examples of the present disclosure provide a circuit device in which a waveguide is integrated into a multilayer substrate in order to transfer RF signals between RF elements formed in or on the multilayer substrate. In this case, the RF elements can comprise RF circuits, such as, for example, RF circuit chips, and/or antennas. In examples, the multilayer substrate can comprise signal routing structures comprising vias and conductor tracks, wherein the circuit device comprises RF elements on or in the multilayer substrate, wherein at least one terminal of a first RF element is coupled by way of the at least one waveguide to a terminal of a second RF element for signal transfer between same. In examples, the RF elements can comprise a local oscillator circuit, at least one transmitting/receiving circuit and at least one antenna, wherein the at least one waveguide is configured to transfer an output signal of the local oscillator circuit to the transmitting/receiving circuit, and/or wherein the at least one waveguide or a further waveguide couples the at least one transmitting/receiving circuit to the at least one antenna. In this case, the local oscillator circuit can be part of a transmitting/receiving circuit, such that two transmitting/receiving circuits, with at least one of the transmitting/receiving circuits comprising a local oscillator circuit, can be connected by way of the waveguide.

In examples, the circuit arrangement is a radar circuit arrangement, wherein the RF elements comprise a plurality of transmitting/receiving circuits, a plurality of receiving antennas, a plurality of transmitting antennas, and a local oscillator circuit, wherein a plurality of corresponding waveguides are provided, which couple the local oscillator circuit to each of the transmitting/receiving circuits and couple the transmitting/receiving circuits to the plurality of receiving antennas and transmitting antennas. One example of such a circuit device is shown in FIG. 9.

Examples of the disclosure provide a radar system comprising a multilayer substrate, at least one waveguide formed in the multilayer substrate, a first semiconductor radar transmitting/receiving circuit and a second semiconductor radar transmitting/receiving circuit, wherein the first semiconductor radar transmitting/receiving circuit is coupled to the second semiconductor radar transmitting/receiving circuit by way of the waveguide, or wherein the first semiconductor radar transmitting/receiving circuit and the second semiconductor radar transmitting/receiving circuit are coupled to a local oscillator circuit by way of a respective waveguide. One example of such a cascaded radar system is shown in FIG. 9, wherein a plurality of semiconductor radar transmitting/receiving circuits 62, 64, 66, 68 are coupled to a local oscillator circuit 60. In other examples, the LO master is not implemented as a separate LO circuit, but rather is formed by a local oscillator in one of the transmitting/receiving circuits. One of the transmitting/receiving circuits can thus act as LO master, which forwards the local oscillator signal to one or more other transmitting/receiving circuits.

In examples, the first and second semiconductor radar transmitting/receiving circuits are configured to generate frequency ramps using a local oscillator signal, wherein at least either the first or the second semiconductor radar transmitting/receiving circuit is configured to receive the local oscillator signal by way of the at least one waveguide. By way of example, the transmitting/receiving circuits 62 to 68 shown in FIG. 9 can receive an LO signal by way of waveguides of the LO distribution network 70. All transmitting/receiving circuits, transceivers, can thus use the same radio-frequency LO signal phase-synchronously to down-convert received radar signals to the baseband, for example.

In examples of the present disclosure, the waveguide or the waveguides of the radar system is or are produced by methods as described herein. Examples of the radar system can thus be produced using individual or all features of methods as described herein for producing a waveguide in a multilayer substrate. In the same way, radar systems as described herein can have some or all features of circuit devices as described herein.

Examples of the present disclosure make it possible to transfer RF signals in radar devices, for example automobile radar devices, with low losses and little crosstalk. Examples enable radar sensors having an increased angular resolution since a larger number of channels can be integrated in a multilayer substrate with longer RF feed lines on account of the lower signal losses and the lower crosstalk. As a result, examples of the present disclosure enable increased object differentiability on account of the increased angular resolution. Examples thus enable a cascading of a plurality of radar MMICs each comprising a plurality of transmitting and receiving antennas.

Although some aspects of the present disclosure have been described as features in association with a device, it is clear that such a description can likewise be regarded as a description of corresponding method features, in particular production method features. Although some aspects have been described as features in association with a method, in particular a production method, it is clear that such a description can also be regarded as a description of corresponding features of a device or of the functionality of a device.

In the detailed description above, in some instances different features have been grouped together in examples in order to rationalize the disclosure. This type of disclosure ought not to be interpreted as the intention that the claimed examples have more features than are expressly indicated in each claim. Rather, as represented by the following claims, the subject matter can reside in fewer than all features of an individual example disclosed. Consequently, the claims that follow are hereby incorporated in the detailed description, wherein each claim can be representative of a dedicated separate example. While each claim can be representative of a dedicated separate example, it should be noted that although dependent claims refer back in the claims to a specific combination with one or more other claims, other examples also comprise a combination of dependent claims with the subject matter of any other dependent claim or a combination of each feature with other dependent or independent claims. Such combinations shall be encompassed, unless an explanation is given that a specific combination is not intended. Furthermore, the intention is for a combination of features of a claim with any other independent claim also to be encompassed, even if this claim is not directly dependent on the independent claim.

The examples described above are merely illustrative for the principles of the present disclosure. It should be understood that modifications and variations of the arrangements and of the details described are obvious to those skilled in the art. Therefore, the intention is for the disclosure to be limited only by the appended patent claims and not by the specific details set out for the purpose of the description and explanation of the examples.

What is claimed is:

1. A circuit device, comprising:
   a multilayer substrate;
   at least one waveguide integrated into the multilayer substrate;
   a first layer arrangement comprising one or a plurality of layers, wherein the first layer arrangement comprises a cutout corresponding to a lateral course of the at least one waveguide in a surface thereof;
   a first metallization in direct contact with surfaces of the cutout,
      wherein the first metallization continuously covers all surfaces of the cutout;
   a second layer arrangement, which comprises one or a plurality of layers and is applied on a surface of the first layer arrangement, wherein a second metallization on the second layer arrangement is arranged above the cutout and together with the first metallization on the surfaces of the cutout forms the at least one waveguide, wherein the second metallization on the second layer arrangement leaves open predetermined lateral regions of the cutout in a vertical direction; and
   coupling elements to couple signals into and out of the at least one waveguide at the predetermined lateral regions of the cutout that are left open in the vertical direction.

2. The circuit device as claimed in claim 1, wherein the second layer arrangement has openings at the predetermined lateral regions of the cutout, wherein surfaces of the openings in the second layer arrangement are metallized and form an extension of the at least one waveguide through at least parts of the second layer arrangement.

3. The circuit device as claimed in claim 1, wherein at least one of the coupling elements is formed by an antenna, wherein the antenna is formed in or on a housing of a radio frequency circuit chip fitted in or on the multilayer substrate, or the antenna is fitted on the multilayer substrate.

4. The circuit device as claimed in claim 1, wherein reflectors are provided on a side of the coupling elements facing away from the first layer arrangement.

5. The circuit device as claimed in claim 1, wherein the multilayer substrate comprises signal routing structures comprising vias and conductor tracks, and wherein the circuit device comprises radio frequency (RF) elements on or in the multilayer substrate, wherein at least one terminal of a first RF element, of the RF elements, is coupled by way of the at least one waveguide to a terminal of a second RF element, of the RF elements, for signal transfer between the first RF element and the second RF element.

6. The circuit device as claimed in claim 5, wherein the RF elements comprise a local oscillator circuit, at least one transmitting/receiving circuit, and at least one antenna, wherein the at least one waveguide is configured to transfer an output signal of the local oscillator circuit to the transmitting/receiving circuit, and/or wherein the at least one waveguide or a further waveguide couples the at least one transmitting/receiving circuit to the at least one antenna.

7. The circuit device as claimed in claim 5, which is a radar circuit arrangement, wherein the RF elements comprise a plurality of transmitting/receiving circuits, a plurality of receiving antennas, a plurality of transmitting antennas, and a local oscillator circuit, wherein the at least one waveguide includes a plurality of waveguides, which couple the local oscillator circuit to each of the plurality of transmitting/receiving circuits and couple the plurality of transmitting/receiving circuits to the plurality of receiving antennas and the plurality of transmitting antennas.

8. The circuit device of claim 1, wherein the second metallization is in direct contact with a top surface of the first layer arrangement, and
   wherein the second metallization is above the first metallization.

9. A radar system, comprising:
   at least one waveguide formed in a multilayer substrate;
   a first semiconductor radar transmitting/receiving circuit and a second semiconductor radar transmitting/receiving circuit,
      wherein the first semiconductor radar transmitting/receiving circuit is coupled to the second semiconductor radar transmitting/receiving circuit by way of the at least one waveguide, or
      wherein the first semiconductor radar transmitting/receiving circuit and the second semiconductor radar transmitting/receiving circuit are coupled to a local oscillator circuit by way of a respective one of a first waveguide, of the at least one waveguide, and a second waveguide of the least one waveguide;

at least one second waveguide integrated into a second multilayer substrate;

a first layer arrangement comprising one or a plurality of layers, wherein the first layer arrangement comprises a cutout corresponding to a lateral course of the at least one second waveguide in a surface thereof; and a metallization in direct contact with surfaces of the cutout wherein the metallization continuously covers all surfaces of the cutout.

10. The radar system as claimed in claim 9, wherein the first semiconductor radar transmitting/receiving circuit and the second semiconductor radar transmitting/receiving circuit are configured to generate frequency ramps using a local oscillator signal, wherein the first semiconductor radar transmitting/receiving circuit or the second semiconductor radar transmitting/receiving circuit is configured to receive the local oscillator signal by way of the at least one waveguide.

11. The radar system as claimed in claim 9, wherein the multilayer substrate is a first multilayer substrate and the at least one waveguide is at least one first waveguide, and wherein the metallization is a first metallization; and wherein the radar system further comprises:

a second layer arrangement, which comprises one or a plurality of layers and is applied on a surface of the first layer arrangement, wherein a second metallization on the second layer arrangement is arranged above the cutout and together with the first metallization on the surfaces of the cutout forms the at least one second waveguide, wherein the second metallization on the second layer arrangement leaves open regions of the cutout at lateral ends thereof in a vertical direction; and coupling elements to couple signals into and out of the at least one second waveguide at the regions of the cutout that are left open in the vertical direction.

\* \* \* \* \*